(12) United States Patent
Plesniak

(10) Patent No.: US 8,633,376 B2
(45) Date of Patent: Jan. 21, 2014

(54) PHOTOVOLTAIC CONCENTRATOR ASSEMBLY WITH OPTICALLY ACTIVE COVER

(75) Inventor: Adam P. Plesniak, Huntington Beach, CA (US)

(73) Assignee: The Boeing Company, Chicago, IL (US)

( * ) Notice: Subject to any disclaimer, the term of this patent is extended or adjusted under 35 U.S.C. 154(b) by 568 days.

(21) Appl. No.: 12/563,644

(22) Filed: Sep. 21, 2009

(65) Prior Publication Data

US 2011/0067758 A1    Mar. 24, 2011

(51) Int. Cl.
*H02N 6/00* (2006.01)
*H01L 31/00* (2006.01)

(52) U.S. Cl.
USPC ............................ 136/259; 136/251; 136/246

(58) Field of Classification Search
USPC ......................................... 136/252, 246, 259
See application file for complete search history.

(56) References Cited

U.S. PATENT DOCUMENTS

| | | | | |
|---|---|---|---|---|
| 4,009,947 A * | 3/1977 | Nishida et al. | ................ | 359/884 |
| 4,069,812 A * | 1/1978 | O'Neill | .......................... | 136/246 |
| 4,191,593 A * | 3/1980 | Cacheux | ....................... | 136/259 |
| 4,626,852 A * | 12/1986 | Dodge | .......................... | 340/985 |
| 4,830,678 A * | 5/1989 | Todorof et al. | ................ | 136/259 |
| 5,118,361 A * | 6/1992 | Fraas et al. | ..................... | 136/246 |
| 5,220,708 A * | 6/1993 | Lucas et al. | ..................... | 16/225 |
| 5,716,442 A * | 2/1998 | Fertig | ............................ | 136/246 |
| 2008/0185031 A1 | 8/2008 | Wang | | |
| 2008/0223443 A1 | 9/2008 | Benitez et al. | | |
| 2008/0264468 A1* | 10/2008 | Young et al. | .................. | 136/246 |
| 2009/0020152 A1* | 1/2009 | Lin | ............................... | 136/251 |
| 2009/0101207 A1 | 4/2009 | Milbourne et al. | | |
| 2009/0107541 A1 | 4/2009 | Linke et al. | | |
| 2009/0159125 A1 | 6/2009 | Prather et al. | | |

FOREIGN PATENT DOCUMENTS

DE   202007009680   9/2007
WO   2009/090843    7/2009

* cited by examiner

*Primary Examiner* — Alexander Kollias
(74) *Attorney, Agent, or Firm* — Diane Tsuda

(57) ABSTRACT

A photovoltaic concentrator assembly that includes a housing that defines an internal volume and includes a rim, wherein the rim defines an opening into the internal volume, a photovoltaic cell positioned in the internal volume, and an optical element that includes an optically active body and a flange extending outward from the body, wherein the flange is sealingly engaged with the rim of the housing to enclose the internal volume.

16 Claims, 4 Drawing Sheets

US 8,633,376 B2

PHOTOVOLTAIC CONCENTRATOR ASSEMBLY WITH OPTICALLY ACTIVE COVER

STATEMENT

This invention was made with Government support under DE-FC36-07G017052 awarded by the Department of Energy. The government of the United States of America has certain rights in this invention.

FIELD

The present patent application relates to photovoltaic concentrator assemblies, also known as photovoltaic receivers or receiver assemblies. More particularly, the present patent application relates to vapor and water-tight photovoltaic concentrator assemblies having an optically active lens that forms the window of the assembly.

BACKGROUND

Photovoltaic concentrator systems use various optical elements to concentrate incoming sunlight onto photovoltaic devices housed in photovoltaic concentrator assemblies, thereby collecting sunlight from a large area and concentrating it on a relatively small target area. Therefore, high efficiency photovoltaic cells, such as gallium arsenide-based ("GaAs") photovoltaic cells, may be used in such photovoltaic concentrator systems in place of less efficient (and less expensive) silicon photovoltaic cells, thereby producing more energy per unit area at a reduced cost.

However, the electronic components of photovoltaic concentrator assemblies, including the photovoltaic cells, are sensitive to external environmental factors, such as temperature and moisture (e.g., humidity). Therefore, various attempts have been made to mitigate the effects of moisture on photovoltaic concentrator assembles. For example, photovoltaic concentrator assemblies have been sealed in compartments provided with windows that allow light to pass to the photovoltaic concentrator assemblies. However, the windows introduce additional optical loss and, therefore, reduce operating efficiency.

Accordingly, those skilled in the art continue to seek advances in the field of photovoltaic concentrator assemblies.

SUMMARY

In one aspect, the disclosed photovoltaic concentrator assembly may include a housing that defines an internal volume and an opening into the internal volume, a photovoltaic cell positioned in the internal volume, and an optical element that includes an optically active body and a flange extending outward from the body, wherein the flange is engaged with the housing to seal the opening.

In another aspect, the disclosed photovoltaic concentrator assembly may include a housing that defines an internal volume and includes a rim, wherein the rim defines an opening into the internal volume, a photovoltaic cell positioned in the internal volume, and an optical element that includes an optically active body and a flange extending outward from the body, wherein the flange is sealingly engaged with the rim of the housing to enclose the internal volume.

In another aspect, the disclosed photovoltaic concentrator assembly may include a housing that defines an internal volume and includes a rim, wherein the rim defines an opening into the internal volume, a photovoltaic cell positioned in the internal volume, an optical element that includes an optically active body and a flange extending outward from the body, wherein the body extends at least partially through the opening such that the flange is aligned with the rim, and a sealing member disposed between the rim and the flange to define a vapor-tight seal therebetween.

Other aspects of the disclosed photovoltaic concentrator assembly will become apparent from the following description, the accompanying drawings and the appended claims.

DETAILED DESCRIPTION

Figure 1:
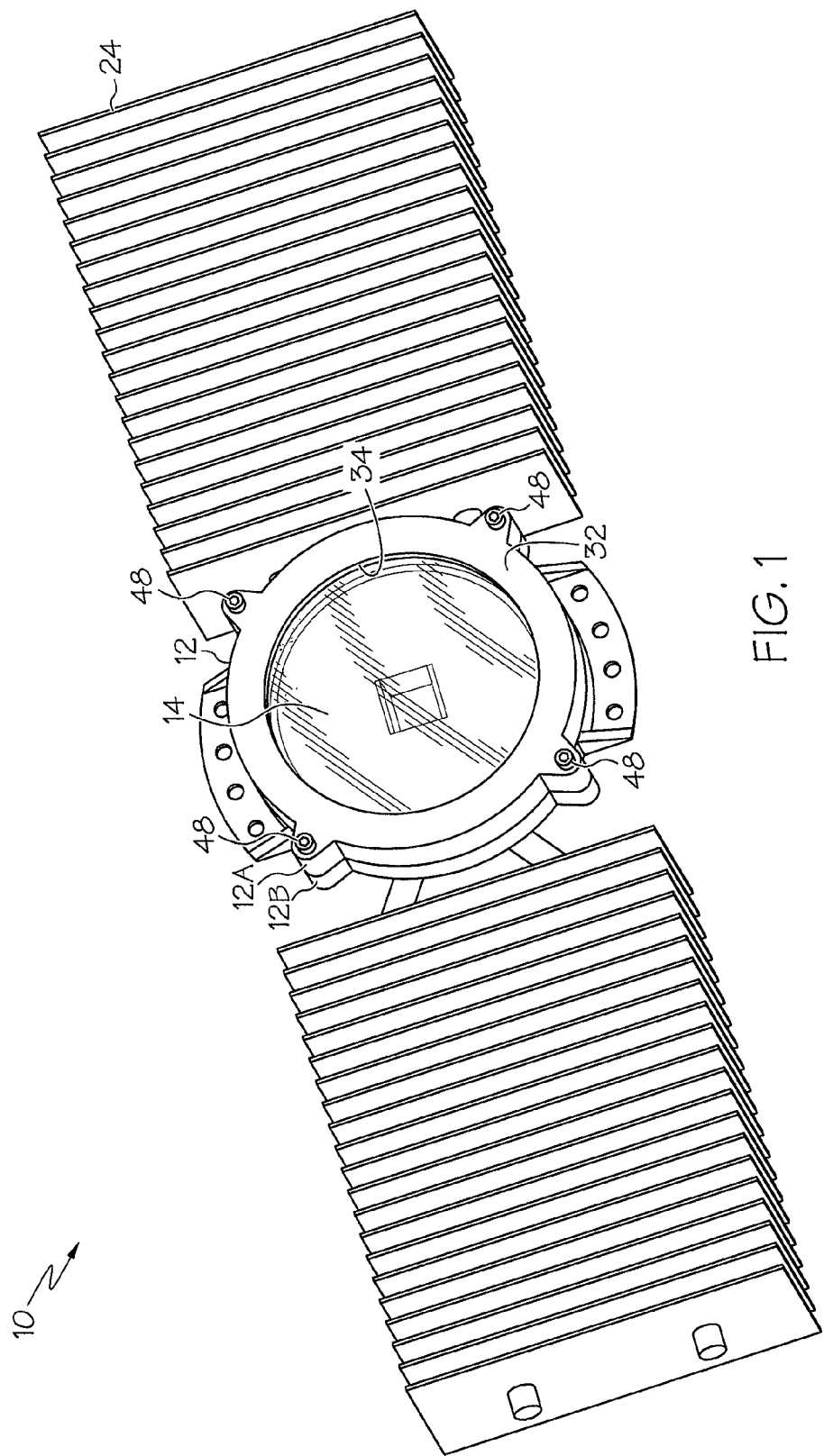
FIG. 1 is a front perspective view of a photovoltaic concentrator assembly in accordance with one aspect of the present disclosure.
Figure 2:
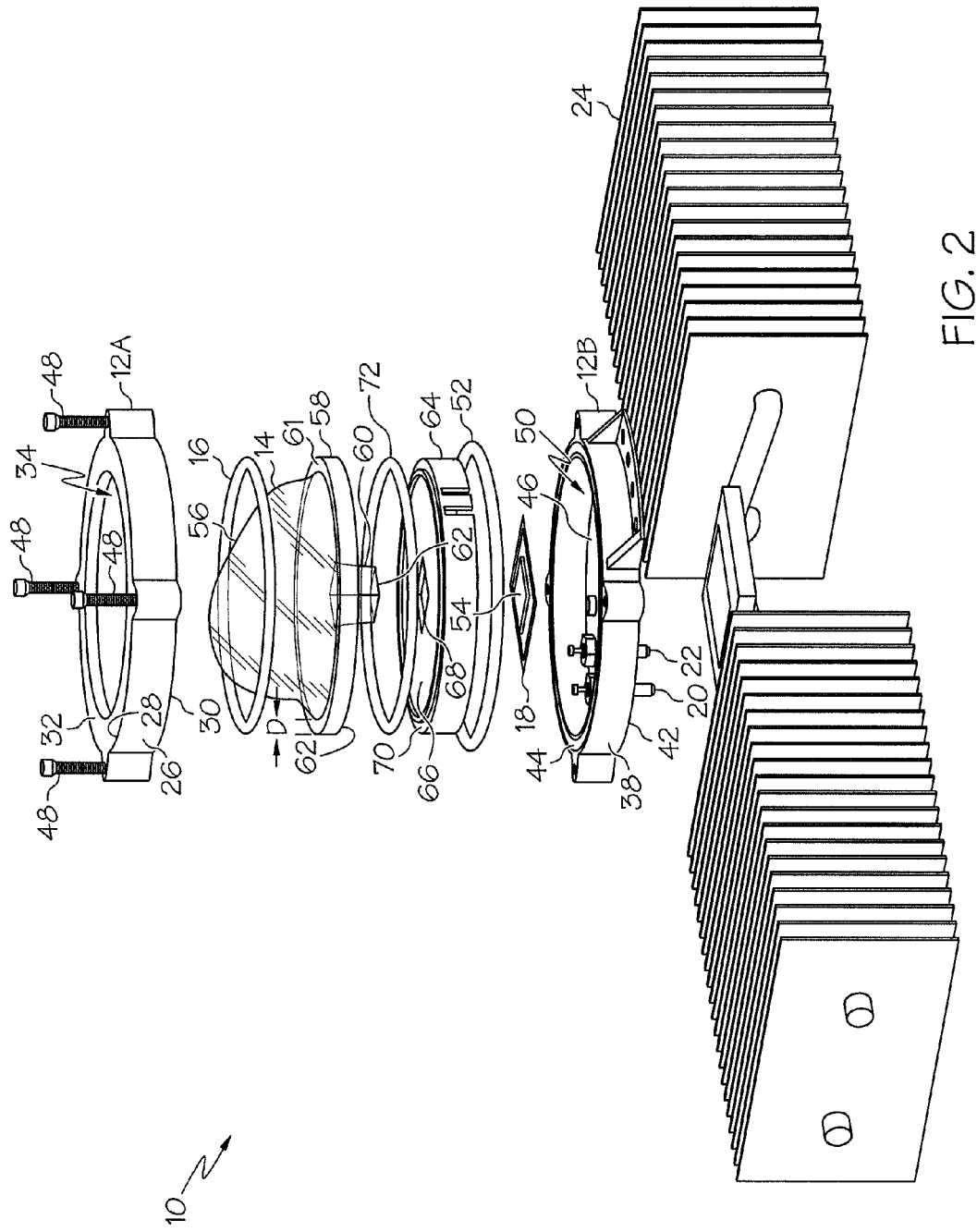
FIG. 2 is an exploded, side perspective view of the photovoltaic concentrator assembly of FIG. 1.

With reference to FIGS. 1-4, one aspect of the disclosed photovoltaic concentrator assembly, generally designated 10, may include a housing 12, an optical element 14, sealing members 16, 72 and a photovoltaic cell assembly 18. The photovoltaic concentrator assembly 10 may be electrically coupled to an external load circuit (not shown) by way of electrical leads 20, 22 (FIG. 2).

Optionally, as shown in FIGS. 1 and 2, the photovoltaic concentrator assembly 10 may further include a heat sink 24 coupled to the housing 12 to dissipate thermal energy therefrom. For example, as shown in FIGS. 1 and 2, the heat sink 24 may be a passive heat sink, such as a finned heat sink with no fluid loop other than evaporation/condensation loop of the fluid (e.g., water) inside the heat pipes. However, those skilled in the art will appreciate that various components, systems and techniques (e.g., active heat exchangers) may be used to dissipate thermal energy from the photovoltaic concentrator assembly 10 without departing from the scope of the present disclosure.

Figure 3:
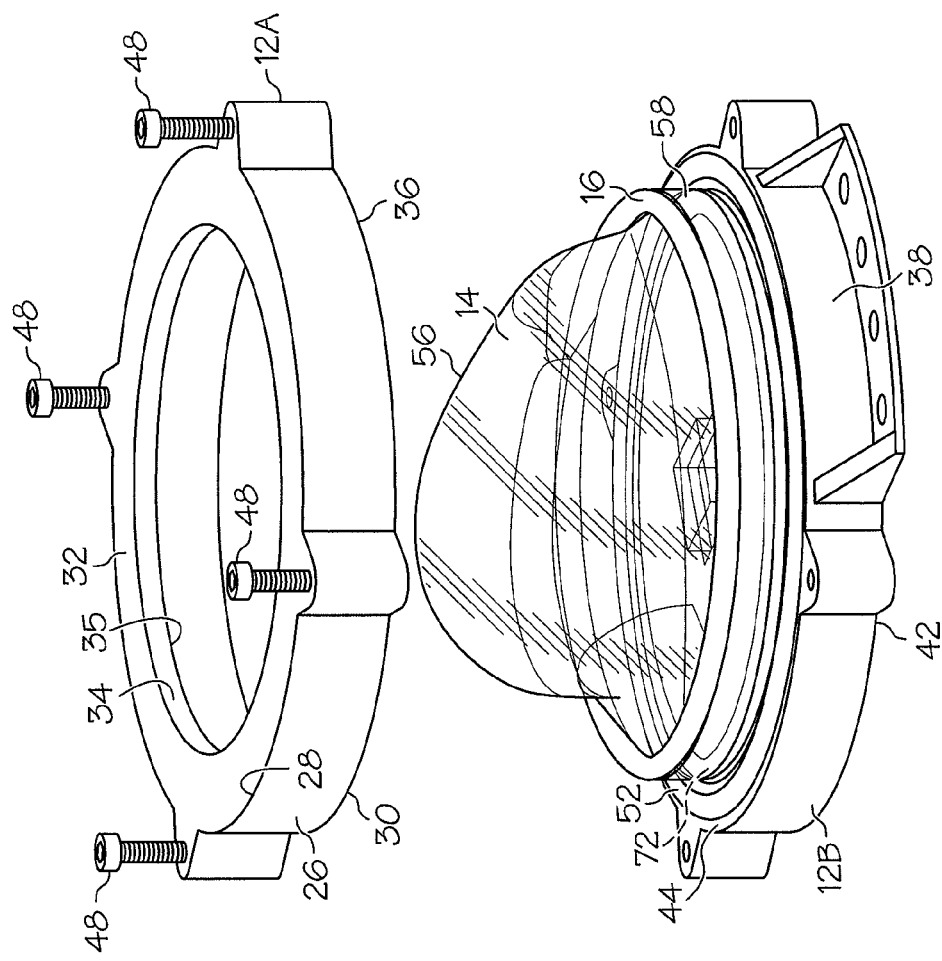
FIG. 3 is a side perspective view, partially exploded, of a portion of the photovoltaic concentrator assembly of FIG. 1.

As shown in FIGS. 2 and 3, sealing members 16, 72 may be O-rings, such as a rubber O-rings. However, those skilled in the art will appreciate that the sealing members 16, 72 may be any type of packing or seal-forming device or material. For example, as an alternative to an O-ring or gasket-type sealing member 16, 72, a bead of rubber or silicon adhesive may be applied to form the sealing member 16 in situ.

Still referring to FIGS. 2 and 3, the housing 12 may include a first, upper portion 12A and a second, lower portion 12B. The first, upper portion 12A of the housing 12 may include a side wall 26, such as a generally cylindrical side wall, having a first, upper end 28 and a second, lower end 30. A rim 32 may extend radially inward from the first, upper end 28 of the side wall 26 and may define an opening (e.g., a circular opening) therein 34. The second, lower end 30 of the side wall 26 may define a first sealing surface 36. The second, lower portion 12B of the housing 12 may include a side wall 38, such as a generally cylindrical side wall, having a first, upper end 40 and a second, lower end 42. The first, upper end 40 of the side wall 38 may define a second sealing surface 44. The second, lower end 42 of the side wall 38 may be connected to a base wall 46.

Optionally, the second, lower portion 12B of the housing 12 may include a flanged attachment surface (see FIGS. 1-4) with holes formed therein for attaching the housing 12 to a higher assembly.

Figure 4:
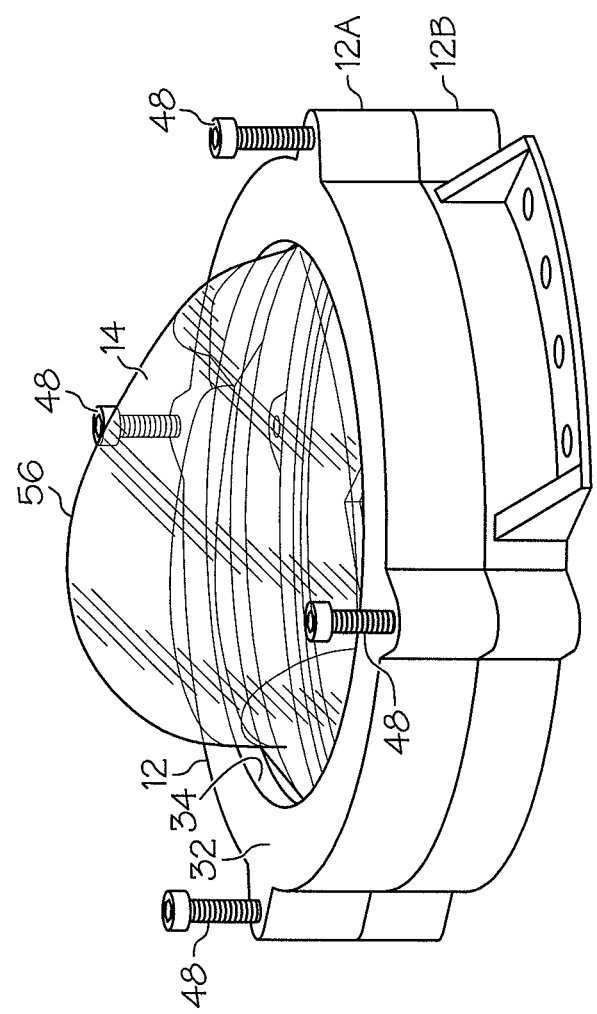
FIG. 4 is a side perspective view of the portion of the photovoltaic concentrator assembly shown in FIG. 3, but shown partially assembled.

As shown in FIGS. 1 and 4, the assembled housing 12 may be formed by connecting the first, upper portion 12A to the second, lower portion 12B with fasteners 48, such as hex screws, thereby defining an internal volume 50 (FIG. 2) within the housing 12. The opening 34 in the first, upper portion 12A may provide access to the internal volume 50.

Optionally, as shown in FIGS. 2 and 3, a sealing member 52, such as a gasket, an O-ring or a bead silicon, may be positioned between the first and second sealing surfaces 36, 44, thereby ensuring a vapor-tight connection between the first, upper portion 12A and the second, lower portion 12B of the housing 12.

At this point, those skilled in the art will appreciate that the housing 12 need not be generally cylindrical in shape with a circular opening, as shown in the drawings, and that the size and shape of the housing 12 and the associated opening 34 and the internal volume 50 may be dictated by the size and shape of the optical element 14 and the photovoltaic cell assembly 18 received in the housing 12.

As best shown in FIG. 2, the photovoltaic cell assembly 18 may include one or more photovoltaic cells 54 and, optionally, one or more other components. The photovoltaic cell 54 may be any device that converts light, either directly or otherwise, into electrical energy. The other components of the photovoltaic cell assembly 18 may include electrical components, such as insulated wires and bypass diodes, or mechanical components, such as adhesives and fasteners.

The photovoltaic cell assembly 18 may be received in the internal volume 50 and connected to the base wall 46 of the second, lower portion 12B of the housing 12. For example, the photovoltaic cell assembly 18 may be connected to the housing 12 using a adhesive, such as 1-4173 thermally conductive adhesive available from Dow Corning of Midland, Mich. However, those skilled in the art will appreciate that various techniques (e.g., mechanical fasteners) may be used to secure the photovoltaic cell assembly 18 to the housing 12 without departing from the scope of the present disclosure.

Referring now to FIG. 2, the optical element 14 may include an optically active body 56 (e.g., a refractive lens) and a flange 58, which may or may not be optically active. The flange 58 may extend outward (e.g., radially outward) a distance D (e.g., 1 cm) from the body 56 about the entire periphery of the body 56. The flange 58 may include a first, upper mating surface 61 and second, lower mating surface 62.

In one particular aspect, as shown in FIG. 2, the body 56 and the flange 58 may be formed as a single, monolithic body. For example, the body 56 and the flange 58 may be formed as a monolithic body of glass. In an alternative aspect, the flange 58 may be a separate piece of material that has been securely connected to the body 56. For example, the flange 58 may be connected to the body 56 using an adhesive, such as an epoxy-based adhesive.

Still referring to FIG. 2, the optical element 14 may optionally include a light guide 60 connected to the body 56. In one particular aspect, the distal end 62 of the light guide 60 may be directly in contact with the photovoltaic cell 54. In another particular aspect, the distal end 62 of the light guide 60 may be connected to the photovoltaic cell 54 using a tape or adhesive, such as an optical tape available from 3M Company of St. Paul, Minn. or LS-6140 optical adhesive available from NuSil Technology of Wareham, Mass. Therefore, light entering the optical element 14 is directed from the body 56 to the light guide 60 and, ultimately, to the photovoltaic cell 54.

At this point, those skilled in the art will appreciate that the optical element 14 may be a secondary optical element, wherein the light coming into the optical element 14 may be light that has first been concentrated by a primary optical element (not shown). In one exemplary aspect, the body 56 and the light guide 60 may be constructed as the free-form secondary lens shown and described in U.S. Ser. No. 12/075,830 filed on Mar. 14, 2008, the entire contents of which are incorporated herein by reference.

In the assembled configuration shown in FIGS. 1 and 4, the first, upper mating surface 61 of the flange 58 of the optical element 14 may be aligned and engaged with the internal surface 35 (FIG. 3) of the rim 32 of the housing 12, thereby sealing the opening 24 in the housing 12, while aligning the body 56 of the optical element 14 with the opening 34. As shown in FIG. 4, in one particular aspect, the body 56 of the optical element 14 may extend through the opening 34 in the housing 12, while the flange 58 may be received in the internal volume 50 and may restrict passage of the entire optical element 14 through the opening 34 in the housing 12. The sealing member 16 may be positioned between the first, upper mating surface 61 of the flange 58 and the internal surface 35 of the rim 32 to ensure a vapor-tight seal therebetween.

A force may be applied to the second, lower mating surface 62 of the flange 58 to urge the upper mating surface 61 of the flange 58 into engagement with the rim 34. For example, the flange 58 may be sandwiched between the rim 32 of the first, upper portion 12A of the housing 12 and the sealing surface 44 of the second, lower portion 12B of the housing 12 such that the upper mating surface 61 of the flange 58 is urged into engagement with the rim 34. Alternatively, as will be described below, the flange 58 may be sandwiched between the rim 32 of the first, upper portion 12A of the housing 12 and a light shield 64 received in the internal chamber 50 such that the upper mating surface 61 of the flange 58 is urged into engagement with the rim 34.

Referring to FIG. 2, an optional light shield 64 may be received in the internal volume 50 defined by the housing 12. The light shield 64 may include a body 66 that defines a window 68 therein. The light shield 64 may be positioned between the optical element 14 and the photovoltaic cell assembly 18 such that the window 68 is aligned with the photovoltaic cell 54, while the body 66 covers the other components of the photovoltaic cell assembly 18. The light guide 60 of the optical element 14 may extend through the window 68 in the light shield 64.

Light shields are described in greater detail in U.S. Ser. No. 12/479,136 filed on Jun. 5, 2009, the entire contents of which are incorporated herein by reference.

In one particular aspect, the body 66 of the light shield 64 may include an upper, sealing surface 70. As shown in FIG. 3, the photovoltaic concentrator assembly 10 may be assembled by positioning the light shield 64 into the second, lower portion 12B of the housing 12, positioning a sealing member 72 (e.g., an O-ring) over the sealing surface 70 of the light shield 64, placing the optical element 14 over the light shield 64 such that the light guide 60 passes through the window 68 and the sealing member 72 is positioned between the sealing surface 70 of the light shield 64 and the second, lower mating surface 62 of the flange 58, and positioning the sealing member 16 over the first, upper mating surface 61 of the flange 58. Then, as shown in FIG. 4, the first, upper portion 12A of the housing 12 may be secured to the second, lower portion 12B of the housing 12, thereby urging the internal surface 35 (FIG. 3) of the rim 32 against the first, upper mating surface 61 of the flange 58 to compress the sealing member 16 therebetween, thereby sealing the opening 34 in the housing 12 with the optical element 14. The sealing surface 70 of the light shield 64 may apply a counteracting force to the second, lower mating surface 62 of the flange 58, thereby maintaining the vapor-tight seal of the opening 34.

Accordingly, the disclosed photovoltaic concentrator assembly 10 employs the optical element 14 as a cover that seals the housing 12, thereby eliminating the need for additional layers or windows in the optical pathway between the light source (or a primary optical element) and the photovoltaic cell, whereby improving operating efficiency.

Although various aspects of the disclosed photovoltaic concentrator assembly have been shown and described, modifications may occur to those skilled in the art upon reading the specification. The present application includes such modifications and is limited only by the scope of the claims.

What is claimed is:

1. A photovoltaic concentrator assembly comprising:
a housing having an annular upper portion and an annular lower portion defining an internal volume, said annular upper portion including an annular upper portion rim having an opening into said internal volume from an exterior of said housing, and including a first sealing surface, and said annular lower portion including an annular lower portion rim and a second sealing surface, said annular upper portion and said annular lower portion being connected at said first and said second sealing surfaces;
a photovoltaic cell mounted on said lower housing portion and positioned in said internal volume opposite said opening;
an optical element including a transparent optically active body extending across said opening to close said internal volume; and
a flange extending outward from and extending about an entire periphery of said optically active body, said flange having an upper surface shaped to engage and form a seal with said annular upper portion and a lower surface shaped to engage and form a seal with said annular lower portion such that said flange is clamped between said annular upper portion and said annular lower portion to form a seal with said annular upper portion and said annular lower portion about said entire periphery of said optically active body, wherein said flange is sealingly clamped between said annular upper portion rim and said annular lower portion rim to enclose said internal volume.

2. The photovoltaic concentrator assembly of claim 1, wherein said annular upper portion rim and said annular lower portion rim are located radially inward of said sealing surfaces of said upper and said lower housing portions.

3. The photovoltaic concentrator assembly of claim 1, further comprising a sealing member disposed between said housing upper portion sealing surface and said housing lower portion sealing surface to create a vapor-tight seal therebetween.

4. The photovoltaic concentrator assembly of claim 1, further comprising a sealing member disposed between each of said annular lower portion rim and said annular upper portion rim and said flange.

5. The photovoltaic concentrator assembly of claim 4, wherein said sealing member includes an O-ring.

6. The photovoltaic concentrator assembly of claim 1, wherein said optically active body and said flange are formed as a monolithic body of glass.

7. The photovoltaic concentrator assembly of claim 1, wherein said optically active body includes a refractive lens.

8. The photovoltaic concentrator assembly of claim 1, wherein said optical element further comprises a guide having a proximal end coupled to said optically active body and a distal end aligned with said photovoltaic cell.

9. The photovoltaic concentrator assembly of claim 8, wherein said guide extends through a window in a light shield positioned between said optical element and said photovoltaic cell.

10. The photovoltaic concentrator assembly of claim 1, wherein said lower housing portion includes a light shield received in said internal volume and disposed between said optical element and said photovoltaic cell, wherein said light shield defines a window that is aligned with said photovoltaic cell.

11. The photovoltaic concentrator assembly of claim 10, wherein said light shield includes an upper sealing surface shaped to engage said flange lower surface about said entire periphery of said optical element to form a seal with said flange lower surface when said upper and lower housing portions are clamped together by said fasteners.

12. The photovoltaic concentrator assembly of claim 11, further comprising a sealing member disposed between said flange and said light shield.

13. The photovoltaic concentrator assembly of claim 1, further comprising a sealing member disposed between said housing and said flange.

14. The photovoltaic concentrator assembly of claim 1, wherein at least a portion of said optically active body extends through said opening.

15. The photovoltaic concentrator assembly of claim 1, wherein said seal is a vapor-tight seal.

16. The photovoltaic concentrator assembly of claim 1, further comprising a heat exchanger coupled to said housing.

* * * * *